United States Patent [19]

Briguet et al.

[11] Patent Number: 4,833,410
[45] Date of Patent: May 23, 1989

[54] SYSTEM OF COILS FOR PRODUCING MAGNETIC FIELD GRADIENTS OF VERY UNIFORM POLARIZATION IN AN IMAGING OR SPECTROSCOPY INSTALLATION BY NMR

[75] Inventors: André Briguet, Villeurbanne; Jean-Jacques Chaillout, Saint Martin de Crossey; Christian Jeandey, Saint Egreve, all of France

[73] Assignee: Commissariat a l'Energie Atomique, Paris, France

[21] Appl. No.: 33,801

[22] Filed: Apr. 3, 1987

[30] Foreign Application Priority Data

Apr. 24, 1986 [FR] France .................. 86 05963

[51] Int. Cl.$^4$ .......................................... G01R 33/20
[52] U.S. Cl. ...................................... 324/318; 335/299
[58] Field of Search ............... 324/311, 318, 319, 320, 324/307, 309; 375/299

[56] References Cited

U.S. PATENT DOCUMENTS

| | | | |
|---|---|---|---|
| 4,456,881 | 6/1984 | Compton | 324/319 |
| 4,486,711 | 12/1984 | Frese et al. | 324/320 |
| 4,646,024 | 2/1987 | Schenck et al. | 324/318 |
| 4,656,447 | 4/1987 | Keim et al. | 324/320 |
| 4,725,803 | 2/1988 | Prevot et al. | 324/320 |

FOREIGN PATENT DOCUMENTS 2070254 9/1981 United Kingdom ............. 324/311

Primary Examiner—Stewart J. Levy
Assistant Examiner—Kevin D. O'Shea
Attorney, Agent, or Firm—Oblon, Fisher, Spivak, McClelland & Maier

[57] ABSTRACT

A system of coils is disclosed for the production of imaging by nuclear magnetic resonance of gradients Gx and Gy. The system of coils is disposed on the outer surface of a straight cylinder of revolution of axis Oz and radius R. The coils include four patterns of conductor wires which are pairwise symmetrical with respect to a center O and pairwise symmetrical with respect to the vertical plane xOy. Each pattern has three arcs participating in the production of the gradient which is required. That is, two outward arcs are located close to the center O at respective distances $h_1$ and $h_2$ from plane xOy and a return arc is spaced further from the center O and is located at a distance $H_3$ from the plane xOy. Each arc has three section a, b and c, with the two end sections a and c having the same length being traversed by a current which has one-half the intensity of the current passing through the central section b.

8 Claims, 8 Drawing Sheets

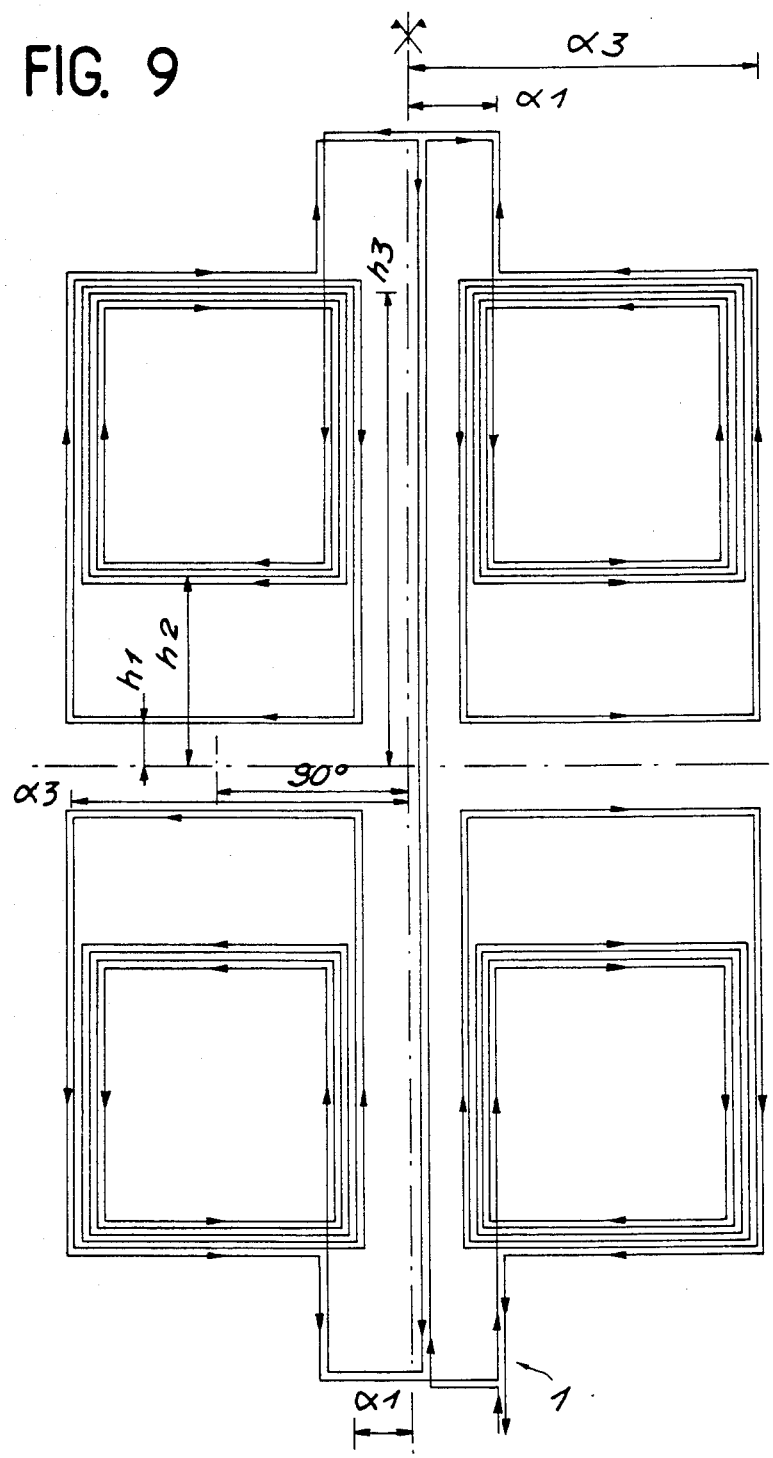

SYSTEM OF COILS FOR PRODUCING MAGNETIC FIELD GRADIENTS OF VERY UNIFORM POLARIZATION IN AN IMAGING OR SPECTROSCOPY INSTALLATION BY NMR

BACKGROUND OF THE INVENTION

FIELD OF THE INVENTION

The present invention relates to imaging, spectroscopy or spectroscopic imaging by nuclear magnetic resonance of a medium to be examined.

The present invention more particularly applies to the imaging or image formation of the human body nuclear magnetic resonance (NMR) making it possible to obtain images with a hitherto unknown quality and precision when using conventional X-ray radiology methods. It more particularly applies to the phase of constructing the thus obtained image by spatial coding and calculation by using a computer.

DISCUSSION OF BACKGROUND

The NMR imaging method utilizes the property of nuclear magnetic resonance of certain nuclei present in the human body and essentially protons distributed throughout the organism, as well as certain nuclei which are of biological interest but which occur in much smaller numbers, such as phosphorus $^{31}P$, potassium $^{39}k$ and sodium $^{23}Na$. By making a map of their concentration at each point of the examined volume, it makes it possible to produce images of living tissues, particularly from the hydrogen contained in water and lipids, which are the essential components of any living matter.

A medical NMR installation essentially comprises a magnet producing throughout the area of the body to be examined a static, uniform, magnetic polarization field $\vec{Bo}$, on which is superimposed with the aid of an auxiliary coil, radiofrequency pulses in a plane perpendicular to the direction of the preceding field $\vec{Bo}$.

The images or informations of a spectroscopic nature are obtained by usually resonating hydrogen nuclei or protons contained in the biological tissues. The signal of the resonances detected during the return to equilibrium in free precession of the spins excited by the radiofrequency field at the Larmor frequency is proportional to the magnetization $\vec{M}$ of the nuclei placed in the magnetic polarization field $\vec{Bo}$. If the continuous polarization field $\vec{Bo}$ is perfectly homogeneous, all the magnetization vectors $\vec{M}$ from the different points of the volume to be imaged or examined are in phase and it is possible in the overall signal received $$s(t) = \iiint_{xyz} M(x,y,z) e^{-t/T_2} dx dy dz$$

to attribute to each point a particular frequency and intensity. In order to be able to identify the contribution to said overall signal of each elementary volume, frequency coding takes place of the space to be examined by superimposing on the field $\vec{Bo}$ additional fields $Bz(x)$, $Bz(y)$ and $Bz(z)$, which linearly vary along one of the coordinates, so that the component of the polarization field $\vec{Bo}+\vec{Bz}$ along Oz has space gradients: $\neq Bz,/\neq x$, $\neq Bz/\neq y$ and $\neq Bz/\neq z$ which are constant in directions x, y and z and satisfy the three following equations:

$$Bz(x) = \frac{\partial Bz}{\partial x} \cdot x = Gx \cdot x$$

$$Bz(y) = \frac{\partial Bz}{\partial y} \cdot y = Gy \cdot y$$

$$Bz(z) = \frac{\partial Bz}{\partial z} \cdot z = Gz \cdot z$$

in which Gx, Gy and Gz are the three constant gradients of the resulting induction along Ox, Oy and Oz. Usage has prevailed in NMR imaging to incorrectly call these additional fields "linear gradients" and this usage will be complied with throughout the remainder of of the text.

All known methods use the Fourier transformation which makes it possible, on the basis of these linear gradients, to obtain a "frequency - space" transposition and, as a result thereof, the construction by the computer of images of the body to be studied.

The present invention more particularly applies in the case of installations operating with the aid of "axial" access magnets and which produce an "axial" field, i.e. in which the body to be examined or to undergo spectroscopy is elongated and extends along the axis Oz of the polarization field.

As an example of the prior art, FIGS. 1 and 2 show embodiments of the coils used for the production of transverse gradients Gx and Gy for reading the result in a nuclear magnetic resonance installation with an axial configuration, in which the polarization field is in direction Oz. Such systems, known as the Golay coil, are more particularly described in U.S. Pat. No. 4,486,711, issued on Dec. 4, 1984.

In these cylindrical structures, the coils for producing field gradients Gx and Gy are made on the surface of a cylinder of radius R and axis Oz and are shaped like saddles (FIG. 1) with one or two outward conductors (FIG. 2). On adopting the spatial orientation Ox, Oy, Oz of FIGS. 1 and 2, the aforementioned coils having current arcs, a, b, c, d, e, f, g, and h for FIG. 1 and a, b, c, d, e, f, g, h, i, j, k and l for FIG. 2, make it possible to obtain linear gradients in directions Ox and Oy perpendicular to the general direction Oz of polarization field $\vec{Bo}$. In the case of FIG. 2, the return current $I_3$ is equal to the sum of the outward currents $I_1+I_2$, because it is a question of closed rectangular frames.

FIG. 1 shows a system of Golay coils producing a gradient Gx, but it is obvious that a rotation of 90° of the complete system around Oz could equally well lead to a system of gradients in direction Oy. This also applies in the case of the apparatus according to FIG. 2.

There is a relative variation of the field gradient in direction Ox less than ±1% in a sphere of radius 0.2 R (R being the support radius of the coils) for the system of FIG. 1 and 0.3 R for the system of FIG. 2.

For fundamental reasons linked with the procedure of NMR imaging, the variation of the magnetic field supplied by a system of linear gradients must be effectively linear with the space coordinate x or y. Unfortunately, the conventionally constructed systems, such as the aforementioned Golay systems only approximately satisfy this condition. Thus, in the presently known systems, it can be considered that the region where the reading gradient produced by the aforementioned coils systems is uniform to within ±1% is a sphere having a radius equal to one third of the radius R of the support of the gradient coil wires. This means that the zone of space around axis Oz in which it possible to obtain high quality spectroscopic informations or images is relatively limited and does not generally exceed one third of the radius of the installation of the gradient coils.

It is therefore very important to be able to increase the volume in which the polarization field gradient is uniform, because such an increase at least brings about the three following advantages:

when the radius R of the gradient coil support is known, the volume of the samples which can be studied by nuclear magnetic resonance (imaging, spectroscopy) is also increased;

for a given sample volume, it is possible with a particular magnet to use gradient coils having a reduced diameter compared with that of conventional coils, which makes it possible to reduce coupling between the gradient coils and the magnet and permit the highest possible gradient switching speeds in imaging and spectroscopic imaging;

another advantage of the possibility of using reduced diameter gradient coils is the fact that the switching power necessary for establishing gradients increases very rapidly with the radius and is substantially proportional to the power of 5 ($R^5$) of the latter.

The mathematical study of the analytical development of the expression of the magnetic field produced by transverse gradient coils can be made with the aid of the method of Legendre polynomials and calls on Legendre functions of order 1 and degree m, associated with Legendre polynomials of order 1. This analytical development is complicated because each order is represented by several terms of the development. However, it is demonstrated that the elimination of the uneven order terms and particularly the terms of order 3 and 5 gives the magnetic field produced by the corresponding coils an excellent spatial linearity. The complete elimination of terms of order 3 and 5, which would be an ideal situation, presupposes that it is possible to bring about the elimination of the different corresponding degrees, respectively 4 and 6.

This is specifically what makes it possible to obtain the system of coils according to the invention having winding shapes which can be realized on a cylindrical surface and able to produce a transverse gradient with respect to the access of said cylinder and which is completely corrected of terms of order 3 and 5 of the analytical development in Legendre polynomials. According to the invention two proposed structures realise this condition and a third, much simpler structure approaches it sufficiently to ensure that the linearity of the gradients obtained is very acceptable.

To simplify the description and the presentation of the claims, throughout the remainder of the text an express description will be given of the production, in an axial structure of axis Oz parallel to the polarization field $\vec{Bo}$, of gradients Gx and Gy of magnetic fields in accordance with one of the directions Ox and Oy perpendicular to the polarization field. However, it must be understood and is also obvious to the Expert, that the coils according to the invention also make it possible to produce a gradient Gz, when the polarization field $\vec{Bo}$ is directed along Ox, i.e. transversely with respect to the axis of the straight cylinder.

SUMMARY OF THE INVENTION

The present invention therefore specifically relates to a system of coils for producing in imaging, spectroscopy or spectroscopic imaging by nuclear magnetic resonance, gradients $G_x$, $G_y$ of magnetic polarization fields which are very uniform in a direction (Ox or Oy) perpendicular to the magnetic polarization field produced in direction Oz by an axial access magnet, whereby said system of coils is placed on the outer surface of a straight cylinder of revolution of axis Oz and radius R in accordance with the diagram of FIGS. 3 and 9, which are planar, developed representations of said outer surface of the straight cylinder assumed to be slotted in accordance with a generatrix of direction Oz, wherein it comprises four patterns of conductor wires pairwise symmetrical with respect to a centre O and pairwise symmetrical with respect to the vertical plane xoy. Each pattern having current lines or arcs disposed in accordance with circular section portions of the straight cylinder and distributed in the following manner:

each pattern has three arcs participating in the production of the sought gradient, namely two "outward" arcs located close to centre O at respective distances $h_1$ and $h_2$ from plane xoy and one "return" arc further from centre O and located at distance $h_3$ from plane xoy;

each arc has three sections a, b and c, whereof the two end sections a and c of equal length are traversed by a current having an intensity half that of the current passing through the central section b, the "outward" currents in the first section of the first two arcs being respectively equal to I and J and the "return" current in the first section of the third arc being equal to I+J; the ratios $h_1/R$, $h_2/R$ and $h_3/R$ are made as close as possible to the values of the following table:

| $h_1/R$ | $h_2/R$ | $h_3/R$ |
|---|---|---|
| 0.15 To 0.3 | 0.7 To 1.0 | 1.5 To 2.5 |

The use of the aforementioned system of coils according to the invention makes it possible to eliminate the terms H31 and H51 from the analytical development of the field, as well as all the terms of degree 3 and degree 5. Thus, there is a relative variation of the linearity of the polarization field, within ±1%, in a sphere of radius equal to 0.4R, R being the radius of the cylinder on which the gradient coils are located.

According to a first important feature of the invention, the system of coils comprises number of turns N1, N2, in the outward arcs and N3 in the return arc of each pattern chosen from the following table in which N3 = -(N1+N2):

| N1 | N2 | N3 |
|---|---|---|
| 1 | 4 | -5 |
| 1 | 3 | -4 |
| 3 | 8 | -11 |
| 2 | 5 | -7 |
| 3 | 7 | -10 |
| 1 | 2 | -3 |
| 4 | 7 | -11 |
| 3 | 5 | -8 |
| 2 | 3 | -5 |

This table makes it possible to choose, without passing beyond the scope of the invention, the number of turns of the outward arcs and the return arc of each pattern, bearing in mind that the return arc still has a number of turns equal to the sum of the turns of the two outwards arcs.

According to the invention, the system of coils can satisfy two different types of structures, as a function of whether the central section b of the arcs of each pattern is large or small compared with the dimensions of the end sections a and c. An optimization of each of these two structures corresponds to the values alpha1, alpha2, alpha3 and alpha4 in the following table of the angles under which, from axis $O_z$, can be seen the sides of each pattern parallel to said axis:

| alpha 1 | alpha 2 | alpha 3 | alpha 4 |
|---------|---------|---------|---------|
| 22°–24° | 82°–84° | 96°–98° | 154°–156° |
| 12°–14° | 48°–50° | 130°–132° | 166°–168° |

The second and third lines of the above table respectively correspond to the first and second structures.

According to the invention, the central section b of each arc of each pattern can be obtained according to two different configurations.

In a first configuration, referred to as "displaced" throughout the remainder of the text, said central section b results from the angular displacement of two identical coils by rotation about axis Oz, making said two coils symmetrical with respect to plane xoz, the two coils also being in series and traversed by the same current.

According to a second configuration called "imbricated" throughout the remainder of the text, the existence of said central section b of each arc is obtained by two independent coils having different widths, with plane xoz as the plane of symmetry and traversed by equal currents.

According to a third system for realising the of coils according to the invention, the central section b of each arc is reduced to zero and the angles alpha1 and alpha2 under which can be seen from axis Oz the sides of each pattern parallel to said axis have values as close as possible to those in the following table:

| alpha 1 | alpha 2 |
|---------|---------|
| 26°–30° | 150°–154° |

Finally, according to a variant of structure 2, corresponding to the case of mutually displaced coils in each pattern, a supplementary turn which is closed on itself is provided along arcs 2 and 3, one inside the pattern and the other outside, as shown in FIG. 7.

BRIEF DESCRIPTION OF THE DRAWINGS

The invention will be better understood from reading the following exemplifed description, provided in an informative and non-limitative manner;

FIG. 9, structure 3 of the coils system according to the invention.

DETAILED DESCRIPTION OF THE PREFERRED EMBODIMENTS

Figure 1:
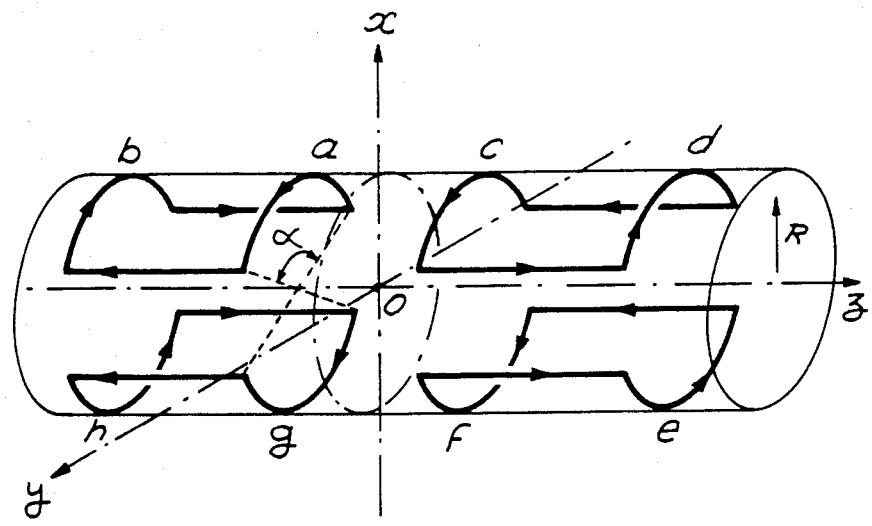
FIG. 1, a prior art embodiment used for the production of transverse gradients Gx and Gy.
Figure 2:
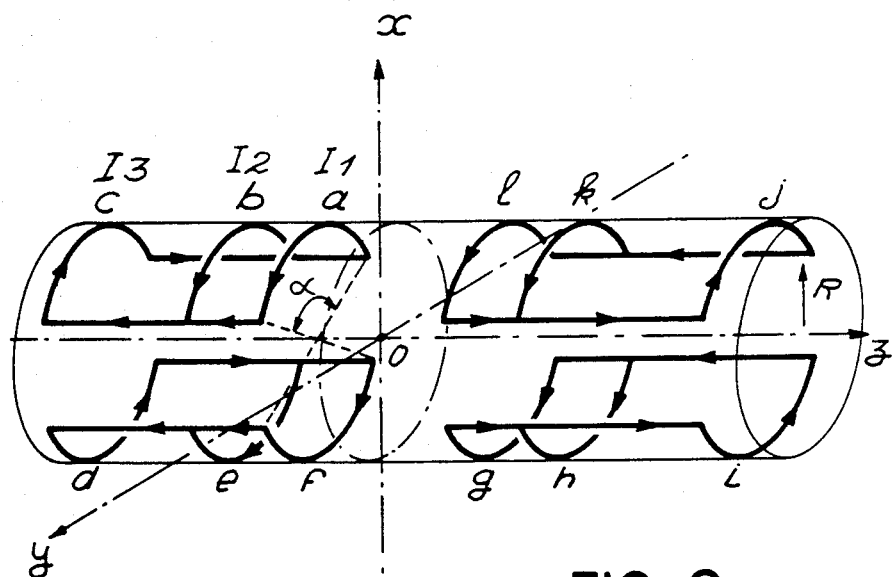
FIG. 2 is a second prior art embodiment for producing field gradients Gx and Gy on the surface of a cylinder of radius R and axis Oz with two outward conductors.
Figure 3:
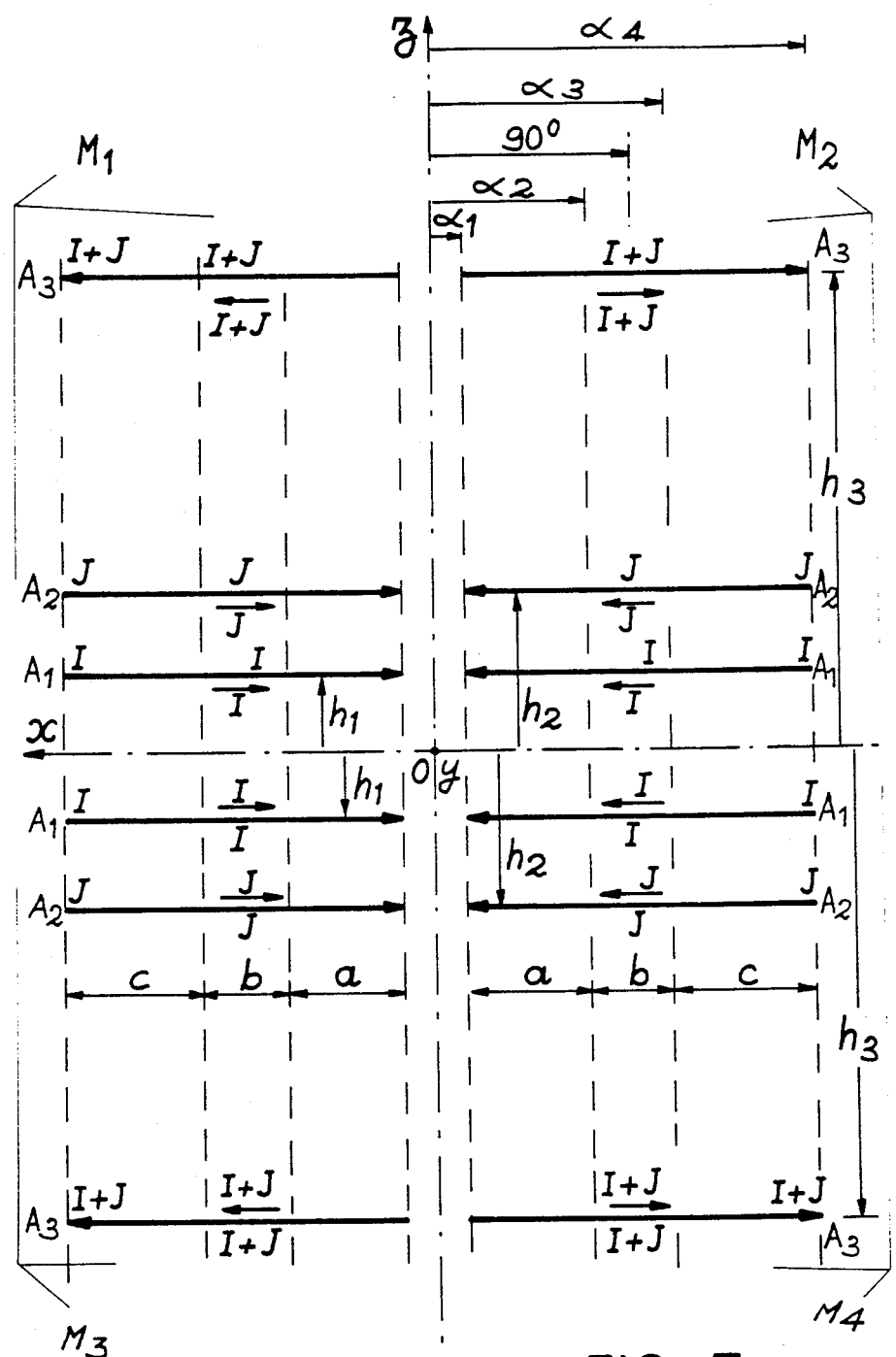
FIG. 3, the general location of the current arcs in the four patterns constituting the system of coils according to the invention with the Figure constituting a planar representation of the sytem of coils and the surface of the cylinder on which the coils are placed being assumed as slotted and open along a generatix parallel to axis Oz.

FIG. 3 diagrammatically shows a system of coils according to the invention comprising, following the flattening of the cylinder on which the coils are placed, the four patterns M1, M2, M3 and M4 from which the system is formed. According to the invention, they are arranged along axes Oz corresponding to the polarization direction and Ox, Oy pairwise perpendicular to the aforementioned axis. Axis Ox is directed from the centre O towards the left, whilst axis Oy is seen from the end towards the centre of FIG. 3.

According to the invention, the four patterns M1, M2, M3 and M4 are each formed by three current arcs A1, A2 for the outward current and A3 for the return current and are pairwise symmetrical on the one hand with respect to plane xOy of FIG. 3 and on the other hand with respect to the centre O thereof. Thus, patterns M1 and M3 on the one hand and M2 and M4 on the other are pairwise symmetrical with respect to plane xOy of FIG. 3. Moreover, and still according to the invention, Patterns M1 and M4 on the one hand and M2 and M3 on the other are also symmetrical relative to centre O located on axis Ox in the centre of the cylindrical coil shown here in developed form. The preceding symmetries must be understood to apply not only with regards to the spatial situations of the different current arcs A1, A2 and A3 in the coils, but also with regards to the directions of said currents in each of the arcs. This is clearly visible in the diagram of FIG. 3, which merely diagrammatically shows the current arcs parallel to plane xOy, i.e. plotted in accordance with cross-sections of the cylinder of radius R perpendicular to axis Oz, said current portions being the only ones which participate in the transverse gradients Gx and Gy which it is wished to produce when the static field Bo is parallel to Oz. For reasons of simplicity, FIG. 3 does not shown the conductor parts of the coils system parallel to axis Oz and which merely serve as connections between arcs, A1, A2 and A3 for lack of producing a useful component for gradients Gx and Gy.

According to the invention, it can be seen that in each of the patterns M1, M2, M3 and M4, the current arcs A1, A2 and A3 are located at respective distances h1, h2 and h3 from the overall plane of symmetry xOy.

Another essential feature of the invention can be seen in FIG. 3 and is based on the fact that each current arc A1, A2 and A3 has three sections a, b and c, whereof the two end sections a and c are traversed by a current whose intensity is half that which passes through the central section b. This is clearly indicated in FIG. 3, where it is possible to see that the outward currents of the first two arcs A1 and A2 are respectively equal to I and J in end sections a and c, whereas they are equal to 2I and 2J in central section b. Moreover, the current in return arc A3 is equal to I+J for the end sections a and c and 2 (I+J) for the central section b.

FIG. 3 also uses a system for the angular designation of the positions of sections a, b and c with respect to the vertical plane yOz, said angular coordinates of the ends of the three sections a, b and c being respectively designated by the angles alpha1, alpha2, alpha3 and alpha4. The centre of central section b corresponds to the angular distance 90° with respect to plane zOy, which means that each of the patterns M1, M2, M3 and M4 of the system of coils according to the invention accepts plane xOy as the plane of symmetry.

Finally, according to another important feature of the invention, ratios h1/R, h2/R and h3/R are made as close as possible to the values in the following table:

| h1/R | h2/R | h3/R |
| --- | --- | --- |
| 0.15 to 0.3 | 0.7 to 1/0 | 1.5 to 2.5 |

FIG. 3 makes it possible to very generally define the geometrical and electrical constitution of the four patterns M1, M2, M3 and M4 forming the different coils systems according to the invention.

It should also be noted that the system of coils according to the invention produces current lines, like those shown in FIG. 3, by using a number of turns N1, N2 and N3 for the three arcs A1, A2 and A3 of each pattern, the number of said turns being on each occasion doubled in the central section b to obtain the doubling of the corresponding intensity. In practice and as will be shown in the following drawings, the four patterns are traversed by the same electrical intensity in series and it is the choice of the number of respective turns N1, N2 and N3 which makes it possible to produce the desired conditions.

It should also be noted that the numbers of turns N1 and N2 in the outwards arcs and N3 in the return arc of each pattern are chosen in the following table, in which for each value group we have N3 = −(N1+N2):

| N1 | N2 | N3 |
| --- | --- | --- |
| 1 | 4 | −5 |
| 1 | 3 | −4 |
| 3 | 8 | −11 |
| 2 | 5 | −7 |
| 3 | 7 | −10 |
| 1 | 2 | −3 |
| 4 | 7 | −11 |
| 3 | 5 | −8 |
| 2 | 3 | −5 |

In practical realizations, a certain number of embodiments are possible and they will be described with reference to the following drawings.

Figure 4:
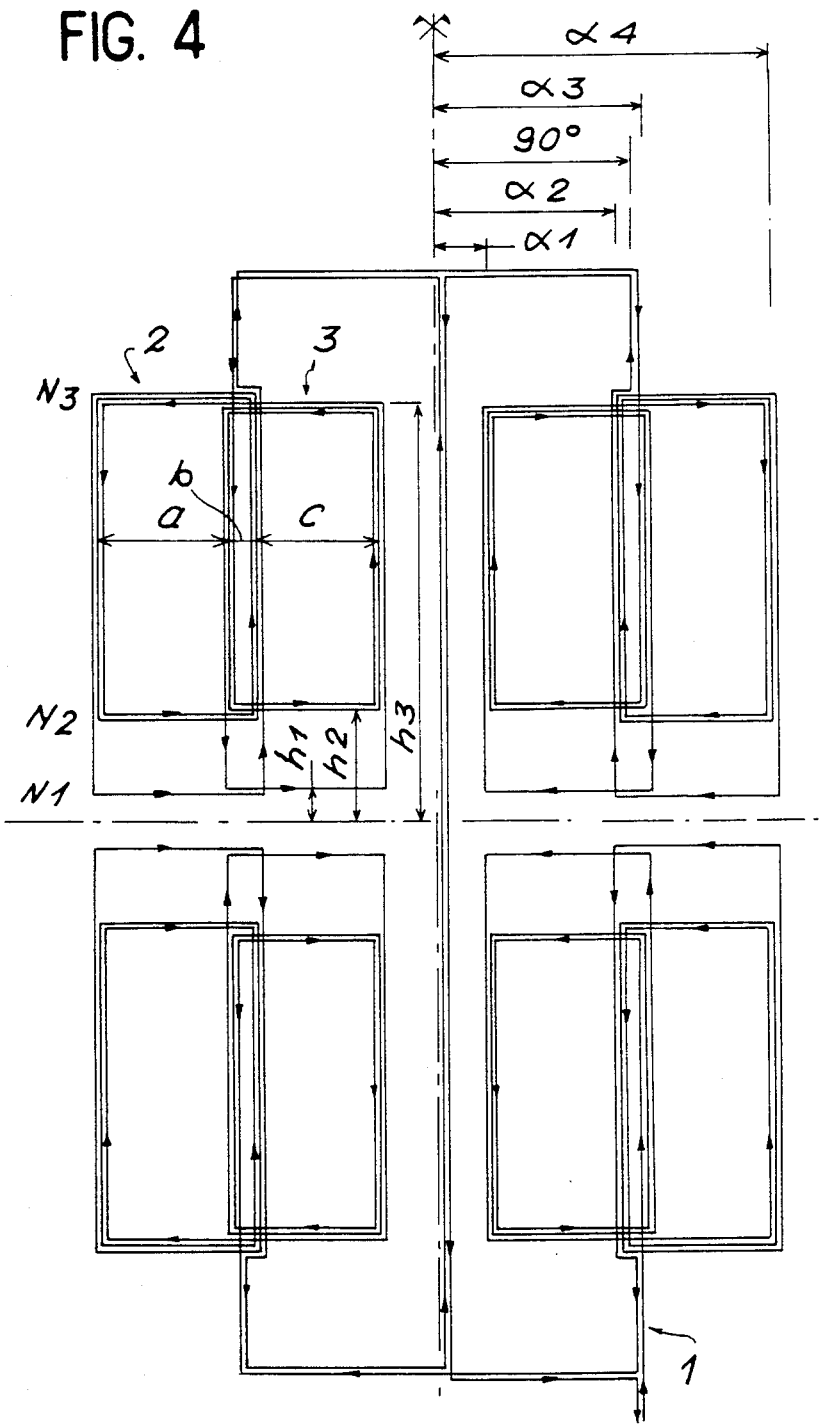
FIG. 4, an embodiment of the "displaced" coils structure 1.
Figure 5:
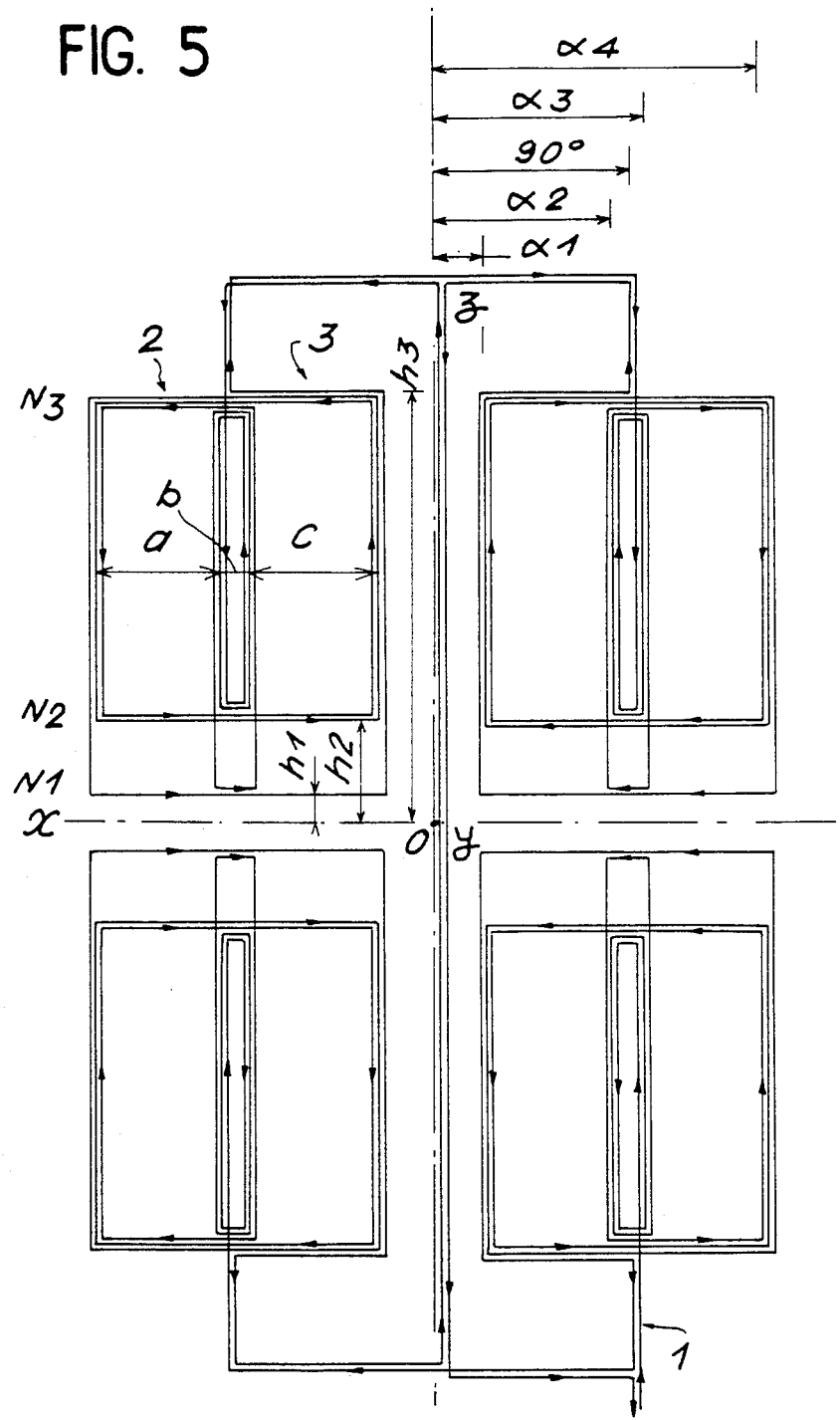
FIG. 5, an embodiment of structure 1 of the system of coils according to the invention in the "imbricated coil" form.

In FIGS. 4 and 5, a description is given of the embodiments of structure 1 according to the invention, in which the central section b of each pattern has small dimensions compared with end section a and c, so that for angles alpha1, alpha2, alpha3 and alpha4 there are values which are close as possible to those of the following table:

| alpha 1 | alpha 2 | alpha 3 | alpha 4 |
| --- | --- | --- | --- |
| 22–24 | 82–84 | 96–98 | 154–156 |

-continued

| alpha 1 | alpha 2 | alpha 3 | alpha 4 |
| --- | --- | --- | --- |
| 12–14 | 48–50 | 130–132 | 166–168 |

In FIGS. 4 and 5, the current enters and leaves a 1 and traverses in series the four patterns M1, M2, M3, and M4 according to the design each time represented. The embodiment represented on these two designs corresponds to N1=1, N2=2, N3=−3.

In the example of structures 1 shown in FIG. 4, the coil has four patterns M, whereof each is of the "displaced" type, which means that the central section b of each of the arcs is obtained with the aid of two coils, such as 2 and 3 in the left-hand part of FIG. 4, which are angularly displaced by rotation about Oz until they are symmetrical with respect to plane xOz and are traversed in series by the same current.

In the imbricated structure of type 1 shown in FIG. 5, the central section b of each arc is obtained by two independent coils of different widths having plane xOz as the plane of symmetry and which are traversed by equal currents. It is clear that the two designs of the current lines of the structures of type 1 of FIGS. 4 and 5 are strictly equivalent from the point of view of the transverse fields produced and therefore the gradients Gx and Gy obtained.

Figure 6:
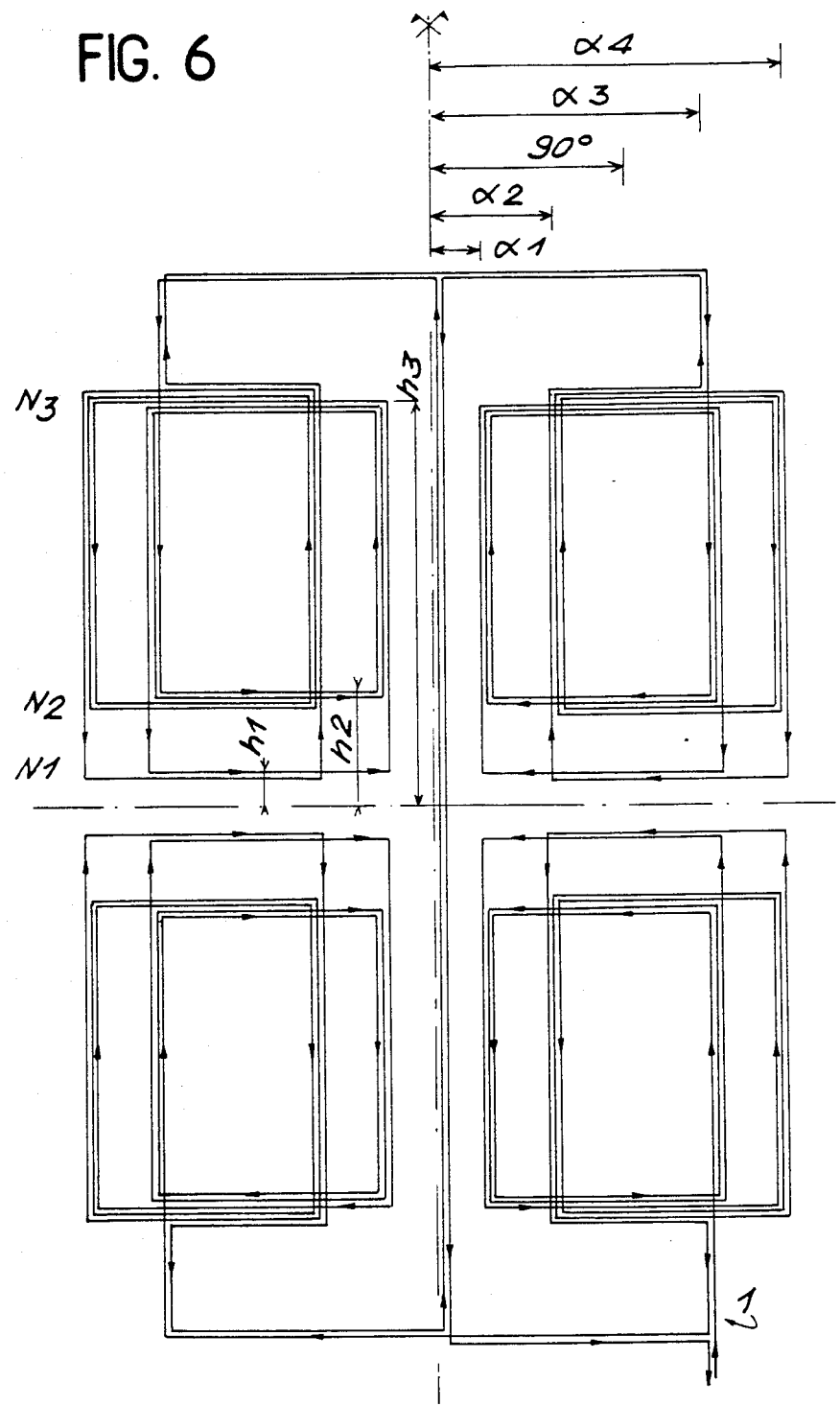
FIG. 6, structure 2 of the system of coils according to the invention in the "displaced coil" form.
Figure 7:
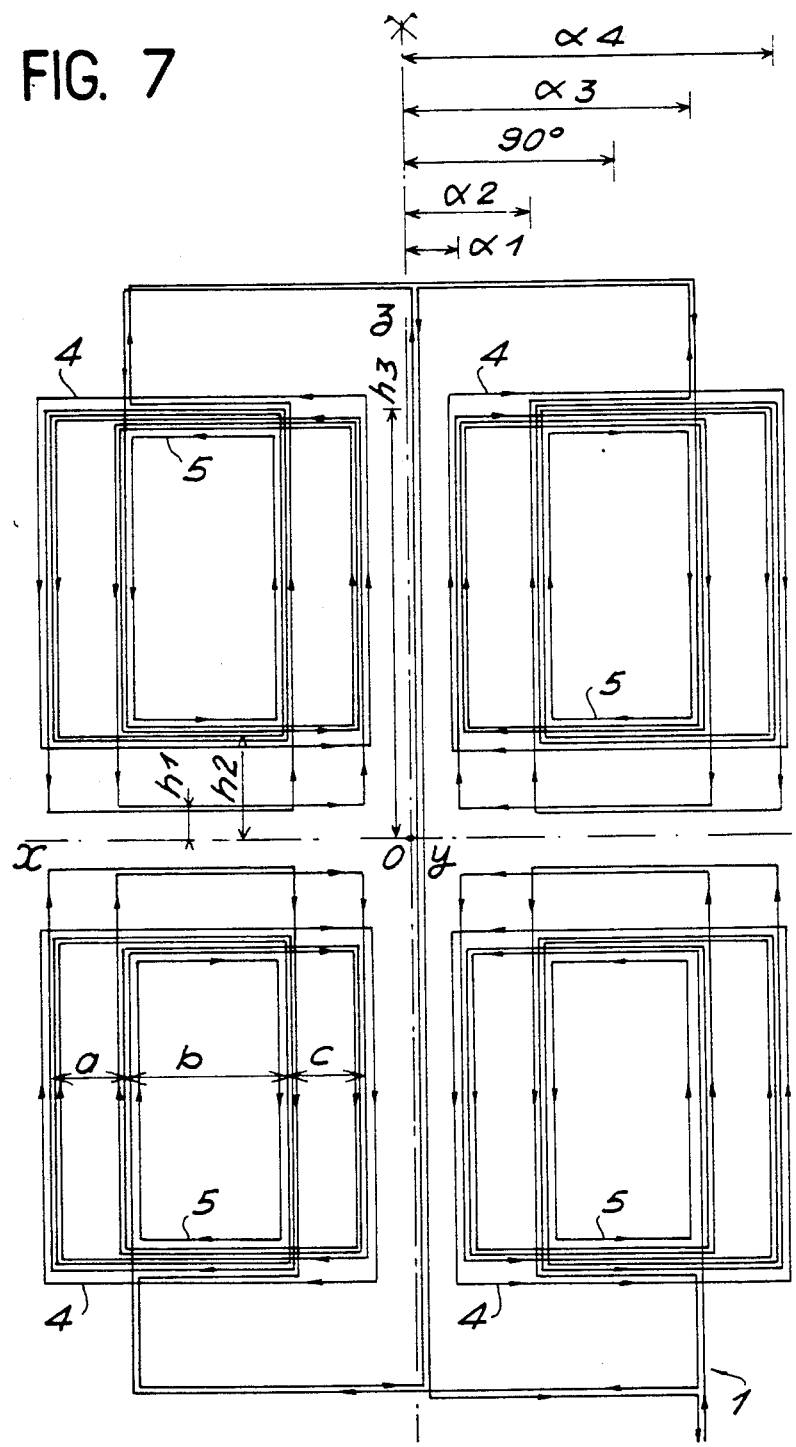
FIG. 7, a variant of structure 2 with "displaced" coil.
Figure 8:
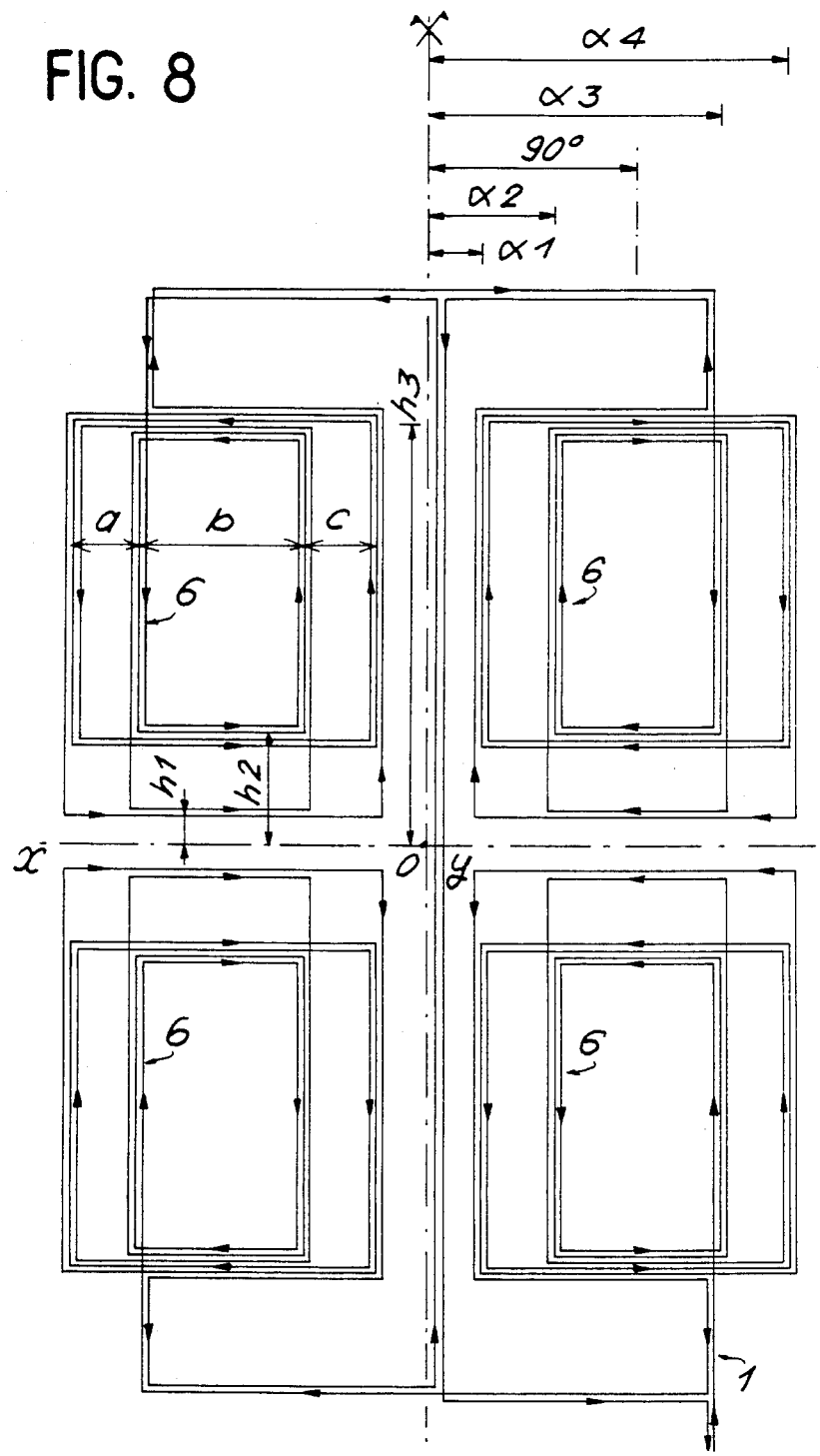
FIG. 8, structure 2 of the coils system according to the invention in the "imbricated coil" form.

FIGS. 6, 7 and 8 show structures of type 2 of the system of coils according to the invention, in which the value of the central section b of each of the patterns N1, N2, N3 and N4 is larger than the value of the end sections a and c. In these three realisation, the angles alpha1, alpha2, alpha3 and alpha4, defined hereinbefore, have values located as close as possible to those in the following table:

| alpha 1 | alpha 2 | alpha 3 | alpha 4 |
| --- | --- | --- | --- |
| 12–14 | 48–50 | 130–132 | 166–168 |

The structures of type 2 of FIGS. 6 and 7 correspond to a "displaced" coil system, as explained hereinbefore, i.e. in which each pattern has two half-coils symmetrically displaced with respect to plane xOz. In the case of the structure of type 2 in FIG. 7, a variant is shown in which, around each of the patterns M1, M2, M3 and M4, has been added a loop which closed on itself and is designated 4 for that which completely surrounds each pattern outside the same and 5 for that which only surrounds the central section of said same patterns. In the particular case of the structure of FIG. 7, there are numbers of turns N1=1, N2=3 and N3=−4.

FIG. 8 shows a structure of type 2 according to the invention using an imbricated coils, in which the current enters and leaves at 1, as in the previous drawings. In said structure 2 of FIG. 8, the central section b is realized as in the case of FIG. 5 by an independent central coil 6.

Finally, FIG. 9 shows an example of structure 3 of the coils system according to the invention corresponding to case in which the central section b of each of the arcs A1, A2 and A3 is reduced to zero and angles alpha1 and alpha 2 under which it is possible to see from axis Oz the sides of each pattern parallel to said axis have values which are as close as possible to 26° to 30° for alpha1 and 150° to 154° for alpha 2. In FIG. 9, the current inlets and outlets take place at 1 and the number of turns of each of the arcs are respectively N1=2, N2=4 and N3=−6. This structure, which is much simpler than that of the previous drawings, results from the fact of passing to the limit of structure 1 of the displaced coil type of FIG. 4, in which the two half-coils 2, 3 have been completely stretched and the central current line in which the overall intensity is zero by definition has been eliminated. With the aid of structure 3 of FIG. 9, there is certainly a somewhat smaller linearity of the transverse gradients Gx and Gy, but is is still very adequate for obtaining good images or correct spectrscopic analyses in numerous applications.

The transverse gradients obtained by the different structures described hereinbefore are corrected of terms of the fifth order and fifth degree, the fifth order and third degree, the fifth order and first degree, the third order and third degree, the third order and first degree, on referring to the analytical expression of their magnitude with the aid of developments using the method of Legendre polynomials.

What is claimed is:

1. A system of coils for producing in imaging, spectroscopy or spectroscopic imaging by nuclear magnetic resonance, gradients $G_x$, $G_y$ of magnetic polarization fields which are very uniform in a direction (Ox or Oy) perpendicular to a magnetic polarization field produced in direction Oz, whereby said system of coils is placed on and fitted to the outer surface of a straight cylinder of revolution of axis Oz and radius R, wherein said system of coils comprises four patterns of conductor wires pairwise symmetrical with respect to a centre O and pairwise symmetrical with respect to the vertical plane xoy, each pattern having current lines or arcs disposed in accordance with circular section portions of the straight cylinder and distributed in the following manner;

each pattern having three arcs participating in the production of the sought gradient, wherein two "outward" arcs are located close to centre O at respective distances $h_1$ and $h_2$ from plane xOy and one "return" arc spaced from centre O and located at a distance $h_3$ from plane xOy where $h_3$ is greater than $h_1$ or $h_2$;

and wherein each arc has three sections a, b and c, whereof the two end sections a and c are of equal length, the "outward" currents in the first section of the first two arcs being respectively equal to I and J and the "return" current in the first section of the third arc being equal to I+J; wherein the ratios $h_1/R$, $h_2/r$ and $h_3/R$ are substantially as shown in the following table:

| h1/R | h2/R | h3/R |
|---|---|---|
| 0.15 To 0.3 | 0.7 To 1.0 | 1.5 To 2.5 |

2. A system of coils according to claim 1, wherein the number of turns N1 and N2 in the "outward" arcs and N3 in the "return" arc of each pattern are chosen in the following table in which, for each group of values, there is N3=−(N1+N2):

| N1 | N2 | N3 |
|---|---|---|
| 1 | 4 | −5 |
| 1 | 3 | −4 |
| 3 | 8 | −11 |
| 2 | 5 | −7 |
| 3 | 7 | −10 |
| 1 | 2 | −3 |
| 4 | 7 | −11 |
| 3 | 5 | −8 |
| 2 | 3 | −5 |

3. A system of coils according to any one of claims 1 or 2, further including angles alpha1, alpha2, alpha3 and alpha4 representing the spacing, from axis Oz, of the sides of each pattern parallel to said axis, said angles having values which are substantially as shown in the following table:

| alpha 1 | alpha 2 | alpha 3 | alpha 4 |
|---|---|---|---|
| 22–24 | 82–84 | 96–98 | 154–156 |
| 12–14 | 48–50 | 130–132 | 166–168 |

4. A system of coils according to claim 1, wherein the central section b of each arc comprises two identical coils angularly displaced by rotation about axis Oz symmetrically with respect to plane xOz and traversed in series by the same current.

5. A system of coils according to claim 1, wherein the central section b of each path is comprises two independent imbricated coils of different widths, having the plane xOz as the plane of symmetry and traversed by equal currents.

6. A system of coils according to either of the claims 1 or 2, wherein the length of central section b of each arc is reduced to zero and further including angles alpha1 and alpha2 representing the spacing, from axis Oz, of the sides of each pattern parallel to said axis, said angles having values which are substantially as shown in the following table:

| alpha 1 | alpha 2 |
|---|---|
| 26–30 | 150–154 |

7. A system of coils according to claim 1, wherein the four patterns thereof are traversed by the same intensity in series and the desired intensities I and J at each point of the circuit are obtained by the choice of the number of respective turns thereof N1, N2 and N3.

8. A system of coils according to claim 1 wherein said end sections a and c are traversed by a current having an intensity half that of the current passing through said central section b.

* * * * *